(12) United States Patent
Krieger

(10) Patent No.: US 7,864,558 B2
(45) Date of Patent: Jan. 4, 2011

(54) METHOD FOR NONDESTRUCTIVELY READING INFORMATION IN FERROELECTRIC MEMORY ELEMENTS

(76) Inventor: Juri Heinrich Krieger, 35 Zolotodolinskaj apt. 6, Novosibirsk, 630090 (RU)

( * ) Notice: Subject to any disclaimer, the term of this patent is extended or adjusted under 35 U.S.C. 154(b) by 278 days.

(21) Appl. No.: 12/284,779

(22) Filed: Sep. 25, 2008

(65) Prior Publication Data

US 2009/0040808 A1 Feb. 12, 2009

(51) Int. Cl.
*G11C 11/22* (2006.01)

(52) U.S. Cl. .................. 365/145; 365/185.05; 257/295

(58) Field of Classification Search .................. 365/145, 365/185.05; 257/295, 315, 316
See application file for complete search history.

(56) References Cited

U.S. PATENT DOCUMENTS

| | | | |
|---|---|---|---|
| 2,791,758 A | 5/1957 | Looney | |
| 3,832,700 A | 8/1974 | Wu et al. | |
| 5,592,409 A | 1/1997 | Nishimura et al. | |
| 6,477,132 B1 | 11/2002 | Azuma et al. | |
| 6,522,568 B1 * | 2/2003 | Nair | 365/145 |
| 6,831,313 B2 * | 12/2004 | Uchiyama et al. | 257/295 |
| 6,858,444 B2 * | 2/2005 | Ahn et al. | 438/3 |
| 6,920,060 B2 * | 7/2005 | Chow et al. | 365/145 |

FOREIGN PATENT DOCUMENTS

| | | |
|---|---|---|
| RU | 2 250 518 C1 | 4/2005 |
| SU | 1387043 A1 | 4/1988 |

OTHER PUBLICATIONS

International Search Report for PCT Appln. No. PCT/RU2006/000298 dated Mar. 1, 2007.

"Reversible Electrical Switching Phenomena in Disordered Structures," Stanford R. Ovshinsky, Physical Review Letters, vol. 21, No. 20, Nov. 11, 1968, pp. 1450-1455.

"Suppression of Ferroelectric Polarization by an Adjustable Depolarization Field," C. T. Black, et al., Appl. Phys. Lett. 71, Oct. 6, 1997, pp. 2041-2043.

"Physics of Thin-film Ferroelectric Oxides," M. Dawber, et al., arXiv:cond-mat/0503372v1, Mar. 15, 2005, pp. 1-47.

* cited by examiner

*Primary Examiner*—Son Dinh
(74) *Attorney, Agent, or Firm*—Holtz, Holtz, Goodman & Chick, PC

(57) ABSTRACT

The method of nondestructive data reading from the ferroelectric memory cell supplied with the electrodes was developed. This method implies supply of reading electric voltage to the memory element electrodes with the view of generation of resilience in the ferroelectric memory cell and registration of the resilience by the field transistor with the floating gate and/or by the conductive channel made from the material with the piezoelectric properties, and according to the value of the current running through the transistor degree and character of ferroelectric cell polarization are identified.

Ferroelectric memory element contains field transistor with extra piezoelement, being the memory cell. Floating gate is based on the piezoelectric material. The memory" "cell has three layer structure consisting of two electrodes, with the piezoelectric made from the ferroelectric material placed between the electrodes over the floating gate and transistor.

Proposed method of information exchange thorough the acoustical channel allows to create fast method of information exchange not only between the memory cell and reading transistor but can become the base of the method of information exchange in the multiplayer schemes of microprocessors and/or between memory array and microprocessor.

22 Claims, 16 Drawing Sheets

US 7,864,558 B2

METHOD FOR NONDESTRUCTIVELY READING INFORMATION IN FERROELECTRIC MEMORY ELEMENTS

CROSS-REFERENCE TO RELATED APPLICATION

This application claims priority from International Application PCT/RU2006/000298 filed Jun. 9, 2006, the entire disclosure of which is incorporated herein by reference.

FIELD OF THE INVENTION

The invention appertains to the computing machinery and can be used in the memory elements of various computers, for the new generation of video and audio hardware design, development of hardware associative memory and data banks with direct access.

BACKGROUND OF THE INVENTION

Modern computers are set up with various memory devices characterized by different writing speed, retention time, time of reading and access to information. This significantly complicates operation of computing systems, increasing period of preparation to work and makes more difficult information storage, etc.

One of the priorities of microelectronics is development of general-purpose memory with high speed of data writing and reading as well as long data storage period and high density of information.

At the same time potential of physical principles serving as a basis for the operation of semi-conductor microelectronic devices is largely exhausted. At present new principles of memory elements functioning are intensely searched for. The most interesting are so called hereditary technologies, these are regularly updated basic technologies, not requiring significant modification in production process.

Ferroelectric memory element (Ferroelectric RAM-FeRAM) is the most rational for the development of non-volatile memory technologies. As a mechanism of data storing in FeRAM ferroelectric effect is used. This effect is characterized by the capacity of ferroelectric material to keep electric polarization in the absence of electric field theoretically endlessly. This is determined by dipole interaction between elementary dipole moments resulting in ferroelectric normalization of dipoles, spontaneous polarization and adequate accumulation of charges on the surface of ferroelectric material. There is some parity with ferromagnetic effect that is, as it is known, widely used for memory elements development.

FeRAM memory element is constructed by setting thin ferroelectric film between two plane metallic electrodes. Its design resembles the capacitor used for the DRAM cell construction, but unlike DRAM storing data as a charge in a capacitor, ferroelectric cell stores data inside the crystalline structure. Ferroelectric crystals keep two steady polarization states—"1" and "0". Since FeRAM cell is free from electron charge leakage causing information loss there is no necessity in recurrent data regeneration as in DRAM. Moreover in case of power-supply cut the data remain safe.

FeRAM memory elements were originally characterized by simplicity, fastness and operational safety attributable to DRAM, as well as energy independence (non-volatility) and period of data storage specific for flash-memory. Among apparent merits of FeRAM there are also radiation and resistance to other penetrating rays that is considered an Achilles heel of flash-memory.

FeRAM memory elements being technological progeny of modern memory types were portioned with their best characteristics—energy independence and fastness of operation. Ferroelectric elements of memory can be considered real contender to become the basic technology for the development of the new generation of nonvolatile memory devices. Although most problems specific for this type of memory have been already overcome, for instance the problem of material deterioration, some issues related to appliance of this technology remain unsettled.

There are a huge number of various ferroelectric cells of memory combining main elements of the memory cell: floating gate made from ferroelectric material and capacitor based on the ferroelectric material. These combinations give 4 basic types all other types of FeRAM cells present only their combinations. These are: 1T FeRAM one-transistor cell composed of the transistor with the gate made from ferroelectric material, 1C FeRAM one-capacitor cell. The most common type is 1T-1C FeRAM transistor-capacitor cell. This type of FeRAM is the closest in its structure to the memory on ferromagnetic cores. The most important positive characteristic of 1C FeRAM one-capacitor cell is a very small size of the element and correspondingly higher information capacity for the chip surface unit.

Main characteristics of the memory elements are information density expressed in the area value of the unit element measured in the units of minimum size acceptable in lithographic process (F); number of writing-reading cycles; retention time.

All types of memory cells can be divided into two main types: reading data from the memory element is followed by data destruction and needs subsequent regeneration of information analogically with the process in dynamic memory elements DRAM. This type of memory elements includes: 1C FeRAM one-capacitor cell, 1T-1C FeRAM transistor-capacitor cell and double cell 2T-2C FeRAM. Main advantage of these elements is practically unlimited time of information storage. Among limitations there are: limited number of data recording-deletion cycles, long time of access to information caused by reading method and size of memory element except for the size of 1C FeRAM one-capacitor cell with $4F^2$ area. This type of FeRAM is the closest in its structure to the memory on ferromagnetic cores. Area of memory element based on 1T-1C FeRAM transistor-capacitor cell is approximately 20-30 $F^2$, this is the parameter in which it significantly concedes 1C one-capacitor and 1T one-transistor cells of ferroelectric memory.

There are elements of ferroelectric memory in which nondestructive data-reading method is applied. One of the mentioned elements is 1T FeRAM one-transistor cell characterized by its small size ($5F^2$). However this type of memory lacks in longevity of data storage. This cell structure was used for one of the first operating FeRAM models made as far back as 1957 (U.S. Pat. No. 2,791,758, U.S. C1.340-173, 1957), (U.S. Pat. No. 3,832,700, IPC G11 c 11/22, G11c 11/40, 1974), but its characteristics did not meet the requirements to energy independent memory: charge compensation of such cell was too fast and the cell became uncontrollable.

Another important characteristic necessary for successful operation of the memory element is polarization value. For normal operation of 1T-1C FeRAM transistor-capacitor cell polarization value should be over 20 $\mu C/cm^2$, sufficient polarization value for 1T FeRAM one-transistor cell is less than 0.2 $\mu C/cm^2$, i.e. for normal functioning of this type of memory polarization value can be hundred times smaller ("Physics of thin film ferroelectric oxides", Rev. Mod. Phys. V.77, p. 1083, 2005r.). Besides it is worth-while mentioning that for normal operation of 1C FeRAM transistor-capacitor cell, as well as for one-capacitor cell, the electrodes of ferroelectric memory cell should have absolute finite charge value that decreases with the decrease of minimum acceptable lithographic size (F). This requires new search of ferroelectric materials with evermore rising value of electric polarization. However it is known that increase of polarization value brings more problems with the increase of recording-reading cycles number. At the same time for 1T FeRAM one-transistor cell operation it is important to have specific surface density of electric polarization value that is rather small (less than $0.2\ \mu C/cm^2$). This is undoubtedly crucial for the diminution of design standards of the lithographic process and for selection of ferroelectric materials compatible with semiconductor technology.

To sum up, there are two types of ferroelectric memory with potentially high information density of great potential interest, but they require further improvement. These are 1C FeRAM one-capacitor memory element with the area of $4F^2$ and 1T FeRAM one-transistor memory element with the area of approximately $5F^2$. Each of them has its advantages and disadvantages.

Thus, (1T FeRAM) one-transistor memory element is the most prospective among ferroelectric memory elements; it has small size and fast access to cells. Besides, this type of memory is characterized with nondestructive data-reading method, small value of electronic polarization, which results in practically unlimited number of recording-reading cycles. All this serves a prerequisite to construction of ideal memory chip based on the present memory element. However there are several significant and practically insurmountable problems for construction of ideal memory chip on the basis of (1T FeRAM) one-transistor ferroelectric memory element.

Main Problems Are As Follows

1. Duration of Data Storage

As a rule, storage period of this type of memory is several hours or days. There are publications informing on the possibility to store data for several weeks. The reach out for a period of storage even as long as a month requires complicated and faintly controllable and renewable technology of production of ferroelectric layer with very low conductivity. Anyway, this type of memory does not meet the main requirement of energy independent memory that is the storage period should be about ten years. Such short period of data storage is caused by the loss of the charge on the surface of ferroelectric layer resulting from depolarization effect and charge leakage. The latter is determined by notable conductivity of ferroelectric layer. Production of ferroelectric material with the conductivity at the level of dielectric layers of flash memory is practically impossible.

2. High Voltage During Programming

This is caused by great difference in dielectric penetrability of ferroelectric layer and buffer dielectric layers. This problem is difficult to overcome in practice.

Research on improvement of memory element based on 1T FeRAM one-transistor cell has started long ago but the problems still remain unsolved and require principally new nondestructive and fast data reading method.

At the same time 1C FeRAM one-capacitor memory element is of great interest; it can serve a basis for creating considerable memory array with the application of rather simple technology. Such memory devices can have specific but wide scope of application. However as it was specified above this type of ferroelectric memory elements has a number of weaknesses.

1. Reading method goes along with destruction of prerecorded information that extends period of accessing the memory element and reduces the number of recording-reading cycles. Development of nondestructive data-reading method is necessary.

2. High absolute value of electronic polarization is required.

SUMMARY OF THE INVENTION

Main purpose of the invention is to create principally new methods of nondestructive data-reading in ferroelectric memory elements that would be characterized by higher information density, fast data-reading and low voltage of programming but at the same time allowing for compatibility of its production technology with the contemporary semiconductors production technology.

As it is known main reasons of charge loss on the transistor ferroelectric gate in 1T FeRAM one-transistor cell are connected with depolarization effect and charge leakage conditioned by finite conductivity of ferroelectric material ("Suppression of ferroelectric polarization by an adjustable depolarization field", Appl. Phys. Lett., v.71, N.14, p. 2041, 1997). It is worthwhile mentioning that the data recorded as a value and direction of polarization of ferroelectric material used for production of transistor ferroelectric gate is stored, but the applied principle of data reading does not provide for its unloading.

At the same time ferroelectric materials have interesting and valuable physical properties such as pyro-electricity and piezoelectricity. These properties are widely used in various methods of image visualization but yet not applied in memory elements production in particular in memory elements based on 1T FeRAM one-transistor cell.

Some materials including ferroelectric ones have unique property to generate electric charges on their surface during heating and cooling. This is widely used in contact-free temperature measurement method and for construction of various IR thermal imagers.

In construction of memory elements on the basis of ferroelectric materials it is necessary to pay attention to the fact that the sign and value of the charge generated on the surface are conditioned by polarization direction and value, and intensity of heating or cooling. Thus, during pulse heating of ferroelectric gate of 1T FeRAM one-transistor cell, it is possible to generate charges on its surface that will in turn result in changing value of current running through the transistor. It makes possible nondestructive reading of electric polarization state of ferroelectric gate, receipt of data on polarization value and direction, i.e. getting data on prerecorded information. There are known memory elements with pulse heating of materials used for memory cell construction ("Reversible Electrical Switching Phenomena in Disordered Steuctures", Phys. Rev. Lett, V. 21, N. 20, p. 1450, 1968). In such cases pulse heating up to 600-7000C is followed by phase transformation crystalline—amorphous state, which differ in resistivity. In the presented case pulse heating does not exceed 50-1000C and amounts only to several tens of degrees.

No less effective and may be even more prospective despite its sophisticated memory element structure is the usage of piezoelectric properties of ferroelectric materials. It is known that piezoelectrics in particular made from ferroelectric materials have unique property to generate electric charges on their surface under pressure that can be either impulse or static. This is a so called direct piezoeffect.

At the same time there is a reverse piezoeffect in which electric voltage applied to piezoelectric induces its resilience. In case ferroelectric materials are used as piezoelectrics the character and value of resilience depend on the value and direction of electric polarization of ferroelectric and naturally on the value and polarity of electric field. Reverse piezoeffect is widely used for generation of resilient deformations, offsets and acoustic waves. As a rule the same element is used both for generation and registration of mechanic deformations and acoustic waves.

While creating memory elements on the basis of ferroelectric materials attention should be paid to the fact that the charge sign and the value of the charge generated on the surface of ferroelectric material are determined by polarization value and direction, as well as resilience intensity and character. As a source of resilient mechanic deformation additional piezoelement can be used, in particular the one made from ferroelectric material.

Piezoelectric materials are widely used in acoustical methods of image visualization. Various echo sounders and scanners are widely used for military purposes, in medicine, etc. Acoustical effects are also used in microelectronics. There is a whole area of microelectronics—acoustical electronics that develops and applies devices with acoustical effects. However piezoelectric properties of ferroelectric materials have not been yet used in memory elements production, in particular in memory elements based on 1T FeRAM one-transistor cell.

Information exchange between ferroelectric memory element and reading transistor with ferroelectric gate going through the acoustical channel serves to develop fast nondestructive data-reading method. This method also serves to the development of multilayer structures for ferroelectric memory with high information capacity where there is common reading element based on the transistor with the floating gate made from piezoelectric that is in particular produced on the basis of ferroelectric material.

Above mentioned physical effects (pyroelectricity and piezoelectricity) make possible nondestructive data reading and open new prospects for construction of memory devices based on ferroelectric storage mechanism and data conversion and for selection of appropriate materials. Usage of pyroelectric and piezoelectric effects will blow a second breath into the development of non-volatile memory technologically compatible with modern semiconductor technology.

There are two methods of data reading from the ferroelectric memory cell: destructible and nondestructive methods. The core of the first one is registration of repolarization current induced by electric field applied to the memory cell exceeding in its value switching threshold of polarization. Such reading method results in the loss of prerecorded data and requires supplementary rewriting. Disadvantages of this method are apparent. These are longer reading period and smaller number of reading and recording cycles. Another nondestructive reading method described above is as follows. Electric field of ferroelectric memory cell polarization constructed as a field transistor floating gate and placed in maximum nearness to the conductive channel of the field transistor determines current running through the conductive channel. According to the current value, direction of electric polarization of the ferroelectric material of the memory cell and therefore the character of the recorded data can be estimated. Disadvantage of this method is short period of data storage conditioned by depolarization effect, conductivity of the ferroelectric material of the memory cell and induced charge leakage.

The essence of the proposed nondestructive method of data-reading from ferroelectric memory cell is based on the fact that during depolarization and charge leakage information recorded on the ferroelectric material of the memory cell does not get lost, but requires another physical action for its extraction. Since all ferroelectrics are at once piezoelectrics then, as it was stated above, it is rather efficient to use direct and reverse piezoeffects for nondestructive extraction and data reading from ferroelectric memory cells.

Presented method of nondestructive reading is as follows. Supply of reading electric voltage to ferroelectric memory cell electrodes induces the resilience wave of ferroelectric material. Depending on the polarization direction and polarity of applied voltage compressure and expansion (extension) waves arise. This resilient wave of deformation advances with the speed of sound and induces the charge on the surface of extra piezoelectric; in this case the charge sign depends on the resilience character. For instance, if the floating gate and/or conductive channel of the field transistor is made from the material with piezoelectric properties, the charge induced on the surface of the floating gate and/or conductive channel allows to identify the value of the current running through the transistor channel. On the current value it is possible to identify the character of resilience and correspondingly the way of polarization or programming of the memory cell that is at once the source of resilience.

In this case two reading modes are possible. According to polarization sign of the ferroelectric memory cell and therefore the sign of induced charge field, transistor either opens or closes up depending on its preceding state, i.e. on the potential applied to the conductive gate of the transistor. Use of one or another reading mode depends on the choice of optimal protocol of information exchange with peripheral chip.

Thus, data couple between the memory cell and reading transistor or the structure including material with piezoelectric properties is set up through the acoustic channel. This method allows for greater distance between the memory cell and the reading field transistor that serves to set up three-dimensional array of memory cells (storage area) with common reading transistor. Usage of the field transistor with a floating gate and/or conductive channel made from the material with piezoelectric properties, as a reader provides for multifold (more than hundred times) increase of the sensitivity to resilience compare to the resilience indicator made as a simple capacitor. This increases the number of ferroelectric materials potentially applicable for production of memory cells, in particular those with lesser value of residual electric polarization but having other positive characteristics, namely short time of programming and large number of rerecording cycles.

Proposed method of information exchange through the acoustical channel between ferroelectric memory element and reader, including material with piezoelectric properties allows to develop the method of fast information exchange not only between the memory cell and for example, reading transistor, but can serve a base for the information exchange method to be used in multilayer schemes of microprocessors and/or between the memory array and microprocessor.

Other solved tasks and advantages of the present invention will be specified below in the brief description of the figures and drawings, in the best possible options of the implementation of the inventions.

The task of the construction of the ferroelectric memory element with nondestructive data-reading method made on the base of the field transistor with the use of piezoelectric effect was solved by adding a piezoelement (1a), being a memory cell to the known 1T FeRAM memory cell containing field transistor consisting of source (4), drain (5), conductive channel (6) and having electrode gate (2) and floating gate (1). The floating gate (1) is made on the base of piezoelectric material and separated from the material of conductive (6) channel of the transistor by the thin buffer dielectric layer (3) (FIG. 1), or at a time by thin buffer metallic (3a) and dielectric layers (3) (FIG. 1a). The memory cell has three-layer structure consisting of two electrodes (2a) и(2b), with the piezoelectric placed in between and made from ferroelectric material and disposed over the floating gate (1) of the transistor (FIG. 1, 1a).

Specified memory element construction provides for non-destructive reading of information recorded in the memory cell. Memory element structure presented in FIG. 1, 1a allows to save information either as a value and direction of electric polarization in the ferroelectric floating gate (1), as it is made in 1T FeRAM one-transistor cell or in the ferroelectric layer (1a) serving a material for production of piezoelement that is a memory cell according to the proposed invention. The latter option is more preferable since significantly decreases the value of programming voltage. In this case field transistor with the piezoelectric floating gate (1) is a transducer of resilience or acoustic waves generated by the memory cell (1a) under the conditions of applied reading potential. Thus the memory cell (1a) is the zone for data storage while the field transistor with the floating gate (1) is the reading zone. It is expedient from the technological point of view to combine functions of the electrode gate of the transistor (2) with the lower electrode of the memory cell (2a) (FIG. 2), (FIG. 2a).

The set task can be also solved with the assistance of the ferroelectric memory element with nondestructive data-reading method, including field transistor containing source and drain areas separated from each other by the conductive channel made from semi-conductive material with piezoelectric properties and electrode gate separated from the conductive channel by the dielectric layer. Ferroelectric memory element contains at least one extra piezoelement made from piezoelectric, being the ferroelectric material, placed between two electrodes, being the memory cell forming data storage area, field transistor being a transducer of resilience generated by the memory cell if reading potential is applied to it, and forms data reading area.

It is rather efficient and expedient to produce memory element, containing field transistor, which channel (8) is made on the base of the semiconductor with piezoelectric properties in particular on the basis of AlN, AsGa, etc. The channel also can be made on the base of any ferroelectric semiconductor. Such semiconductors have high sensitivity to resilience and at the same time are characterized by high mobility of charge carriers. In this case there is no necessity to use additional ferroelectric layer in the production of the transistor floating gate (FIG. 3, 3a). Thus, the channel of the field transistor itself serves as a transducer of resilience or acoustic waves generated by the memory cell (1a) when reading potential is applied to it and generates charges congruent to information recorded in the memory cell. It is also very efficient to produce a reading field transistor with a channel based on the heterostructures (9, 10) made in particular on the basis of AlN, AsGa (FIG. 4, 4a). Such heterostructures (9, 10) have higher resilience sensitivity and are characterized by high level of mobility of charge carriers. This significantly simplifies the production technology of the memory cell and notedly increases speed of data reading.

It is rather efficient to construct memory elements array with the data storage area made as a multilayer structure (FIG. 5) consisting of 2-4 or more layers of ferroelectric memory cells (1a). Information storage area be made as a multilayer structure that layers are separated from each other by dielectric layers (FIG. 5) or every upper electrode of the memory cell be made conjoint with the lower electrode of the memory cell of the following layer (FIG. 5a). This significantly increases informational density of the memory element without fundamental complication of its structure since resilience waves (acoustic waves) outspread in solids with small losses and to great distances. At the same time, highsensitive one-transistor cell with piezoelectric floating gate (1) provides for fast registration of the resilience wave induced by application of reading potentials to ferroelectric memory cell (1a). Thus, by electrical contact free method using only acoustical communication channel reading area collects data from the data storage area.

It is rather efficient to construct one-dimensional memory array using as a reading area one-transistor cell with elongate conductive channel (6a) with 2-4 or more insolated piezoelectric floating gates (1) (FIG. 6, 6a) and accordingly with two or more memory cells (1a) placed over them and separated from each other by insolating dielectric (7) (FIG. 7) or every upper electrode of the memory cell be made conjoint with the lower electrode of the memory cell of the following layer (FIG. 7a).

It is prospective to construct one-dimensional array of memory elements using as a reading area one-transistor cell with elongate conductive channel (6a) with one elongate piezoelectric floating gate (1c) (FIG. 8) and accordingly with 2-4 or more ferroelectric memory cells placed over it and separated from each other by the insolating dielectric (7). In this case it is also expedient and possible to use multilayer structure of data storage area constructed analogically with the one presented on the FIG. 7.

It is technologically advantageous to construct one-dimensional array of memory elements using as a reading area one-transistor cell with elongate conductive channel (6a) with one elongate piezoelectric floating gate (1c) and accordingly with 2-4 or more ferroelectric memory cells not separated from each other by the insolating dielectric (FIG. 9). In this case it is also possible to use multilayer structure of data storage area. This option is more preferable due to more compact distribution of memory elements and simplified technology of their production without losses in operational reliability of the memory array.

It is rather efficient to produce ferroelectric memory element with indestructive data-reading method and with inducement of the charge in the memory cell by means of resilience but without the reading transistor, i.e. to base on 1C FeRAM one-capacitor memory element. Such element consists of at least two piezoelements separated from each other by the dielectric layer (3) and laid on the insulated substrate (11) (FIG. 10). Every piezoelement has threelayer structure, consisting of two electrodes (2a and 2b), with piezoelectric placed between them. At least one of the piezoelements is a memory cell and should be made from the ferroelectric material. In this case piezoelement (1) is a source for reading resilience impulses generating charges on the ferroelectric memory cell (1a). Generated charges produce adequate voltage impulses on electrodes (2a) and (2b), which polarity and value depends on the value and direction of ferroelectric memory cell polarization, i.e. from prerecorded information. These voltage pulses can be more effectively traced by the off-chip amplifier, which operation can be optimized for registration of the induced charge in the absence of external switchable electric field that are normally used for charge generation in 1C one-capacitor memory element.

To increase the value of generated charge in 1C one-capacitor memory element it is quite efficient to produce the ferroelectric memory element as a multilayer structure consisting of two piezoelements (1) and one ferroelectric memory cell (1a) placed between them (FIG. 11). This will provide for double increase of resilience range by means of two synchronously operating piezoelements and accordingly, double increase of the value of the charge generated on the memory cell. It is very efficient to use alternating lineup of piezoelements in the memory cell for construction of the multilayer structure of the memory elements (as it is shown on FIG. 11), adding required number of piezoelements to construct appropriate memory array on this basis.

It is preferable to construct the source of resilience as a multilayer piezoelement with the structure consisting of two ramified electrodes (2c) and (2d) and piezoelectric placed between them (1) (FIG. 12). This will serve to increase reading resilience range 2-4 times and more without the increase of voltage applied to electrodes (2c) and (2d), and accordingly increase the range of voltage impulse generated on the memory cell (1a). This in turn will serve to construct multilayer structure of data storage area. It is technologically advantageous to produce one-dimensional array of memory elements using as a reading resilience source an elongate piezoelement with the structure consisting of two ramified electrodes (2c) and (2d) and piezoelectric placed between them (1), on the analogy with the FIG. 8, FIG. 9. Accordingly the memory element includes 24 or more ferroelectric memory cells placed over it and separated from each other by the insolating dielectric.

It is expedient to construct ferroelectric memory element with nondestructive data-reading method on the basis of 1T FeRAM one-transistor cell with the use of pyroelectric effect. In the known structure of 1T FeRAM memory cell, containing field transistor, consisting of the source (4), drain (5), conductive channel (6) with two (FIG. 13) or three layer structure of the floating gate (FIG. 13a), and including ferroelectric material (1a) and electrode (12). Specific feature of this electrode (12) is its material with notable resistivity that allows pulse current running through to heat ferroelectric material of the cell. Thus, such electrode is simultaneously the heater. In the result of pyroelectric effect during heating of ferroelectric material charges generate on its surface. Their sign and value depend on the value and direction of ferroelectric memory cell polarization, i.e. on prerecorded information. Certain charge fosters either closing or opening of the transistor. Thus, according to the value of the current running through the transistor prerecorded information can be viewed.

It is also useful to make ferroelectric memory element based on 1C one-capacitor memory element as a simple capacitor (FIG. 14), which electrodes (12a) and (12b) are made from special material with notable resistivity that allows running pulse current quickly heat ferroelectric material of the cell. As a result of the pyro-electric effect during effective heating of ferroelectric material electric charges generate on its surface. Generated charges create corresponding voltage impulses on the electrodes (12) and (12a), which polarity and value depend on the value and direction of ferroelectric memory cell polarization, i.e. prerecorded information. These voltage impulses can be more effectively traced by the off-chip amplifier which operation can be optimized for registration of the induced charge in the absence of externally switchable field that is normally used for charge generation in 1C one-capacitor memory element.

Sign and value of pyro-electric voltage depend on the value and direction of ferroelectric memory cell polarization, i.e. on the prerecorded information. On the basis of the ferroelectric memory element made as a simple transistor it is possible to produce multilayer memory element consisting of 2-4 and more simple memory elements, and three-dimensional array from simple memory elements divided by dielectric material (7).

It is expedient to produce memory chips on the basis of the memory elements described above, using usual schemes for forming of memory elements array applied in production of flash memory, namely NOR and NAND lineup.

BRIEF DESCRIPTION OF THE DRAWINGS

On FIG. 1-FIG. 14 there are options of claimed structures of ferroelectric memory elements that can serve to realization of nondestructive methods of data reading.

BEST OPTIONS OF THE INVENTION IMPLEMENTATION

Option 1

Figure 1:
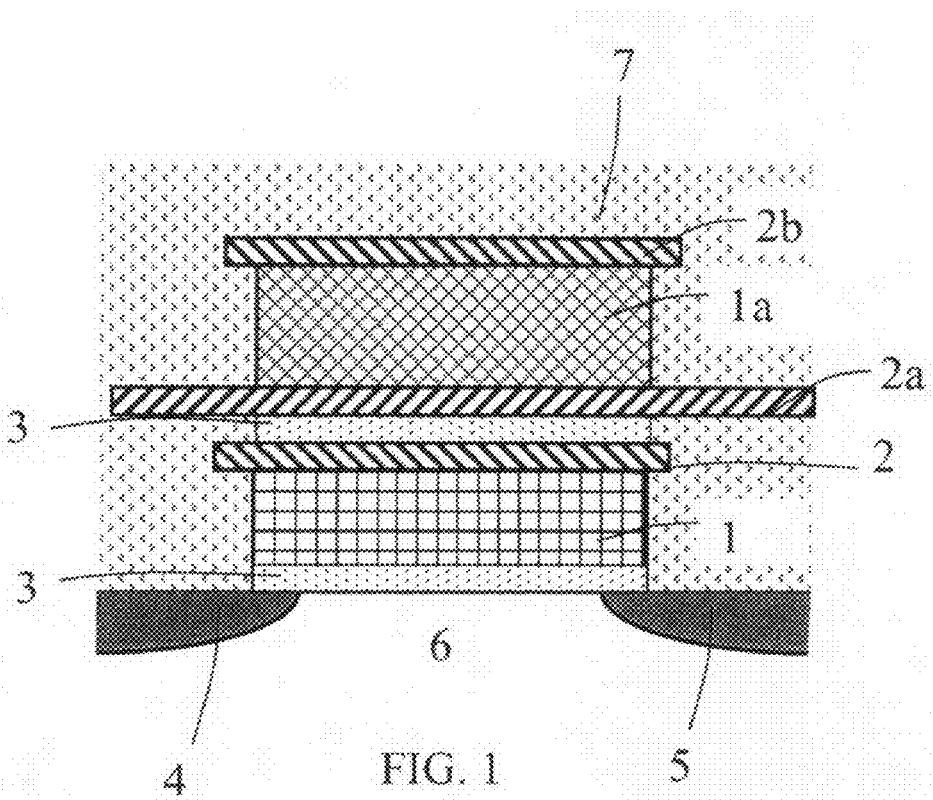
FIG. 1-2a—claimed ferroelectric memory elements using piezoelectric effect and made on the base of the field transistor.
Figure 1A:
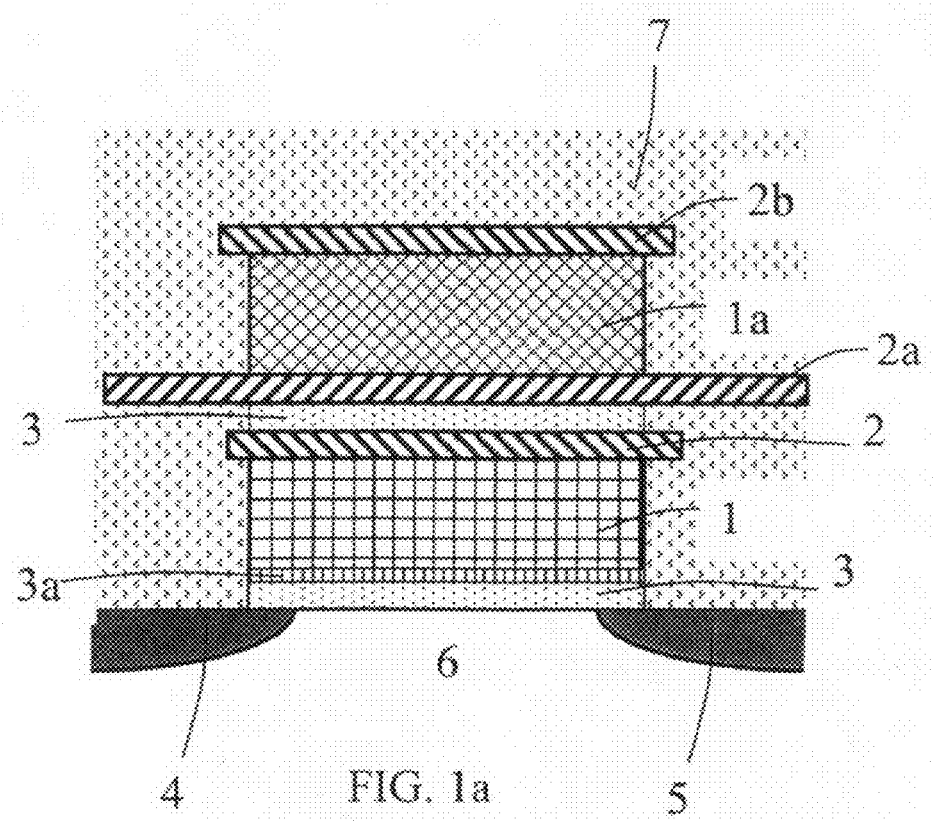
Figure 2:
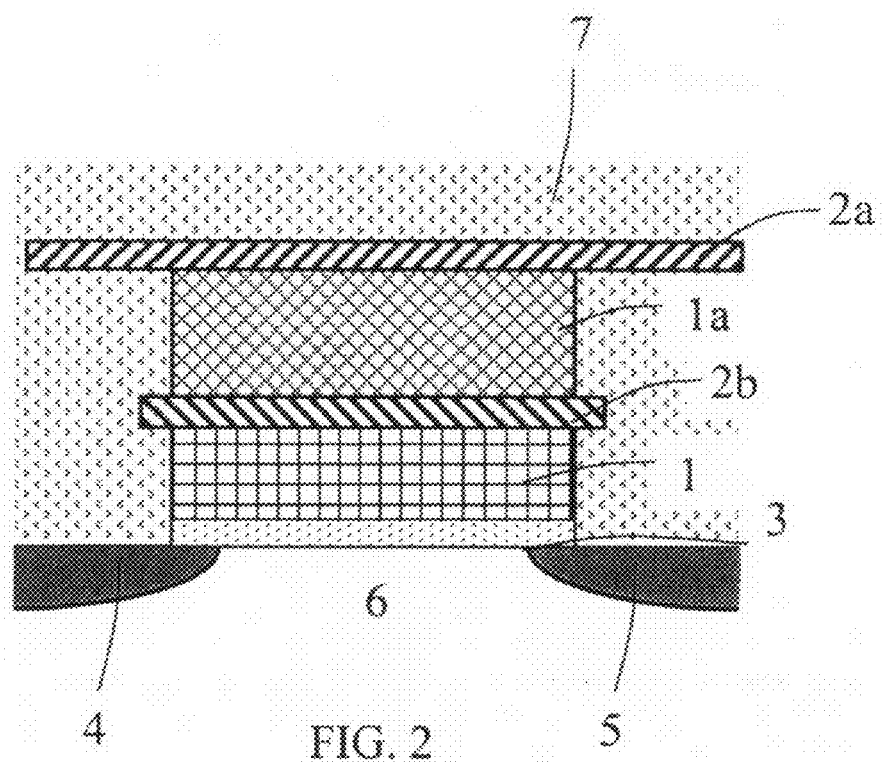
Figure 2A:
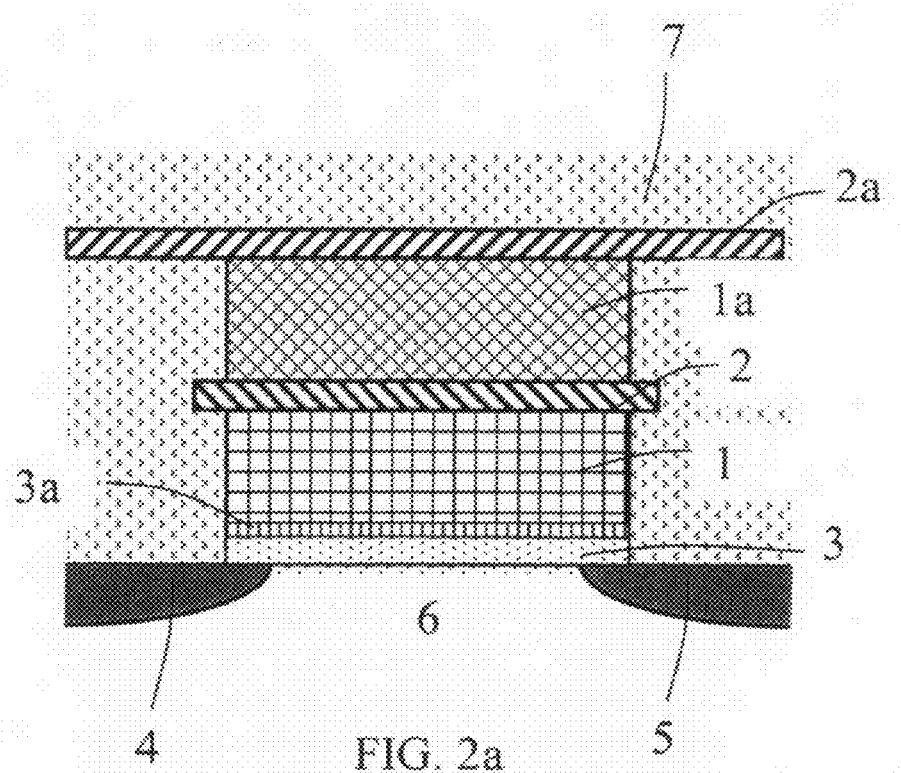
Figure 3:
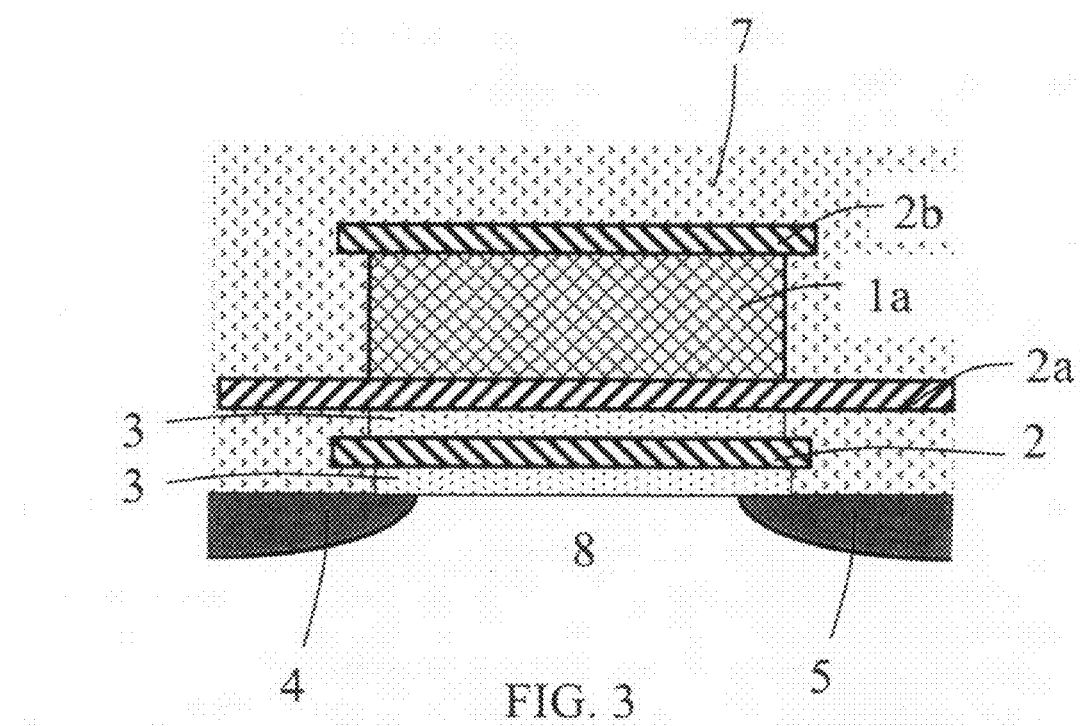
FIG. 3-4a—claimed ferroelectric memory elements using piezoelectric effect and made on the base of the field transistor constructed on the basis of the semiconductor with piezoelectric properties (ferroelectric semiconductor or heterostructures made in particular on the base of AlN, AsGa)
Figure 3A:
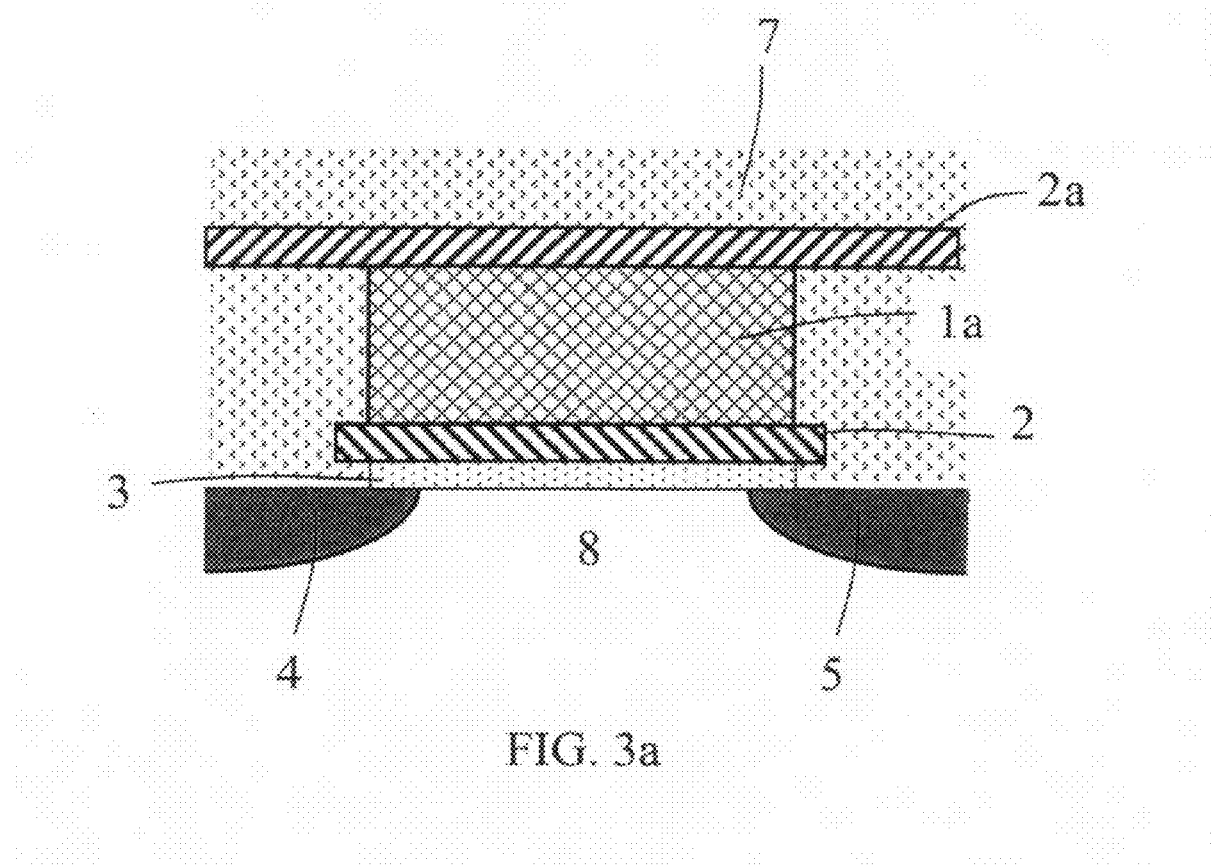
Figure 4:
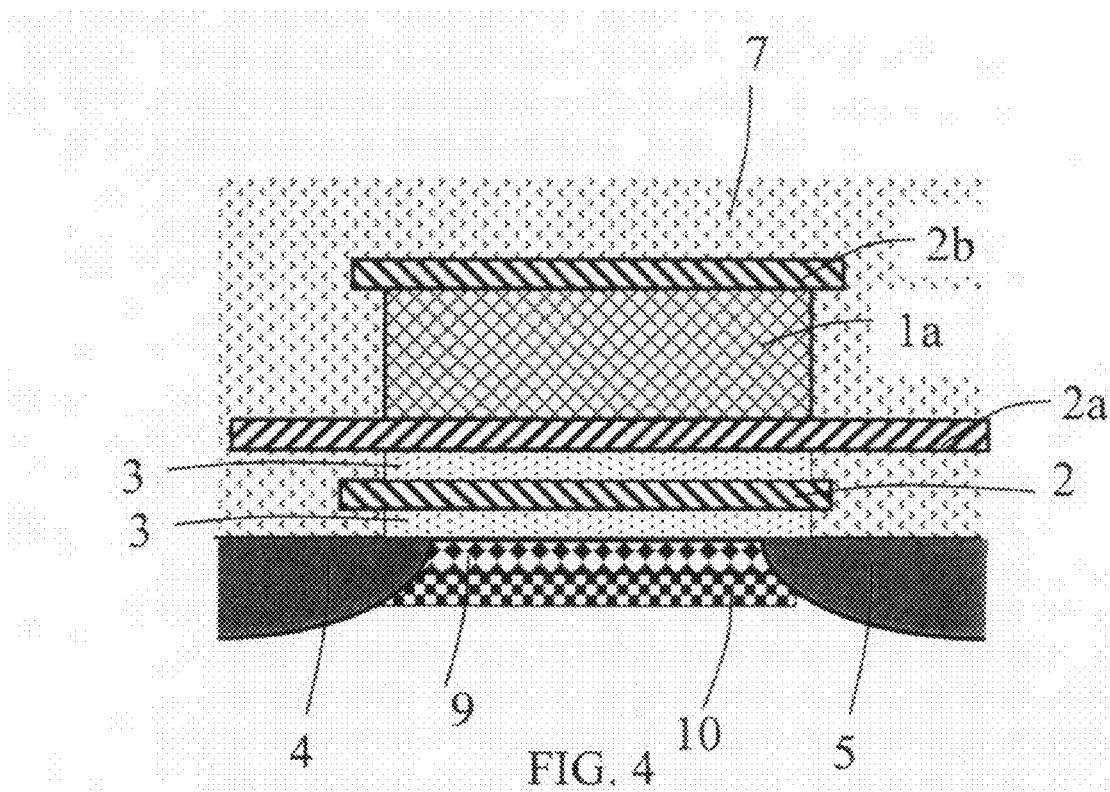
Figure 4A:
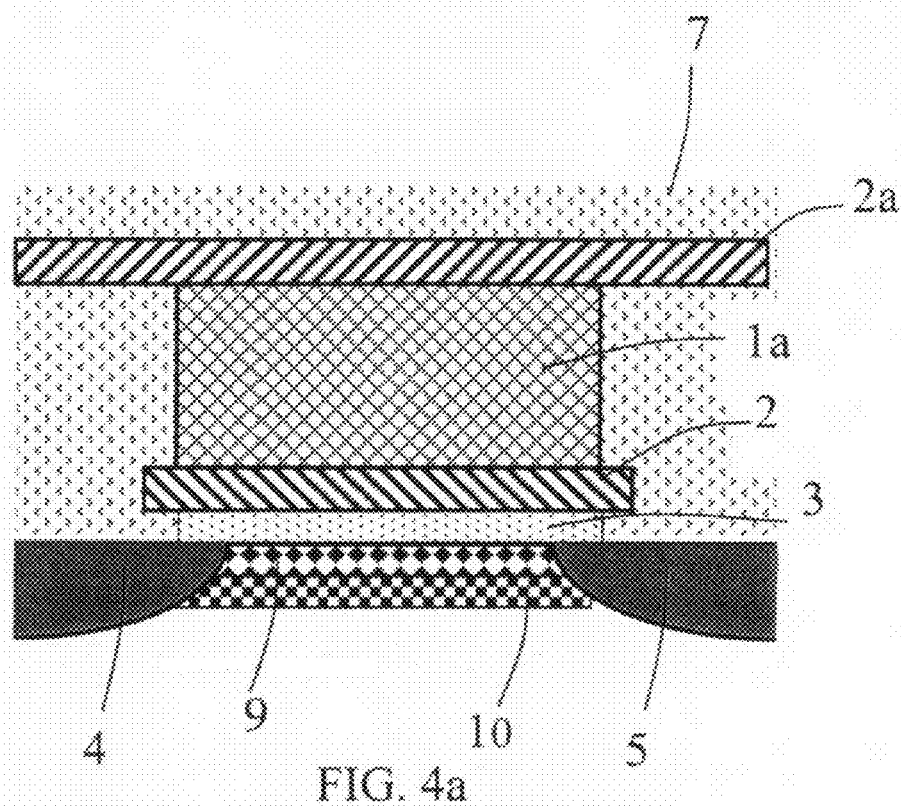
Figure 5:
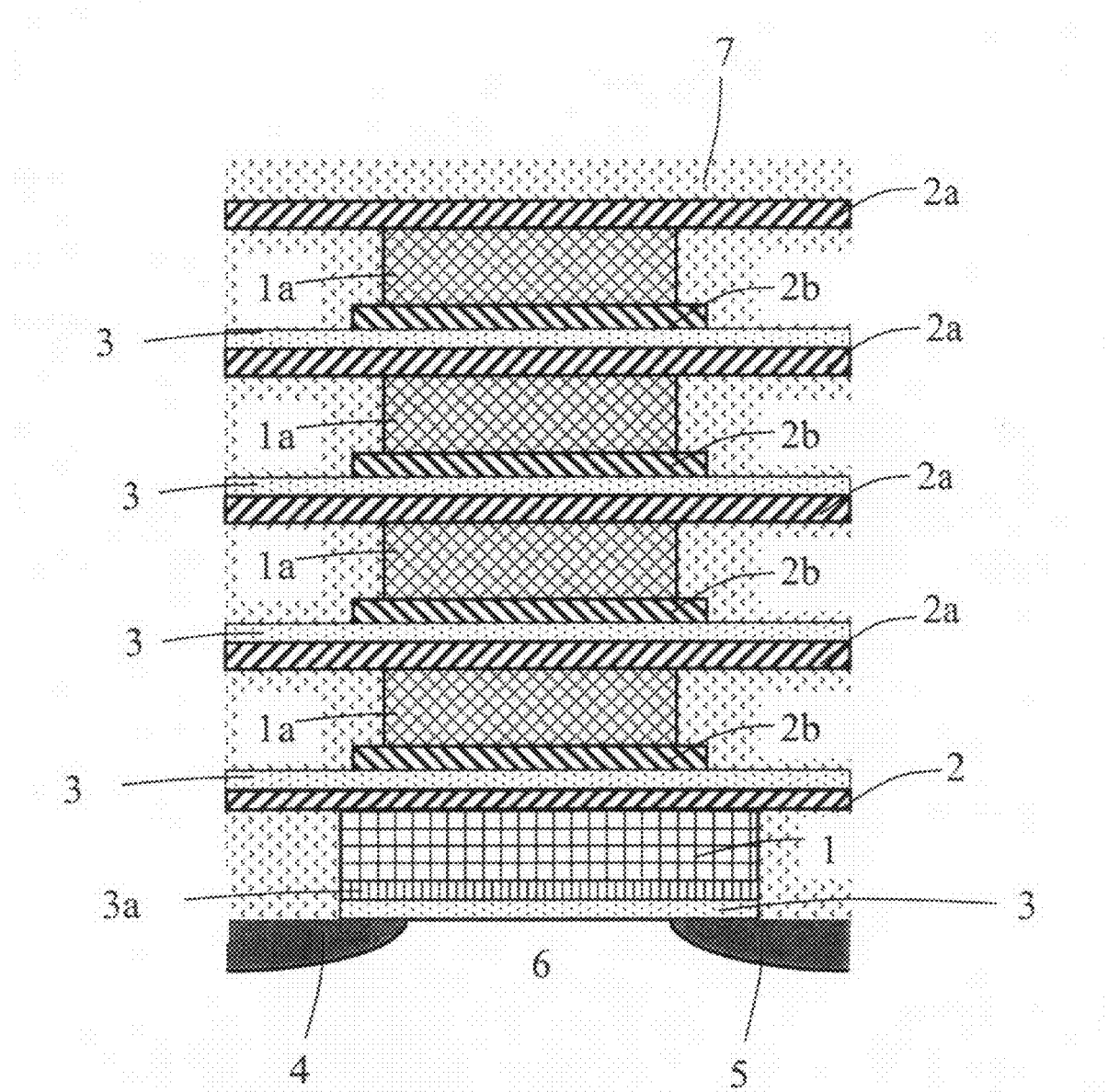
FIG. 5, 5a—claimed memory elements array with the information storage area constructed as a multilayer structure.
Figure 5A:
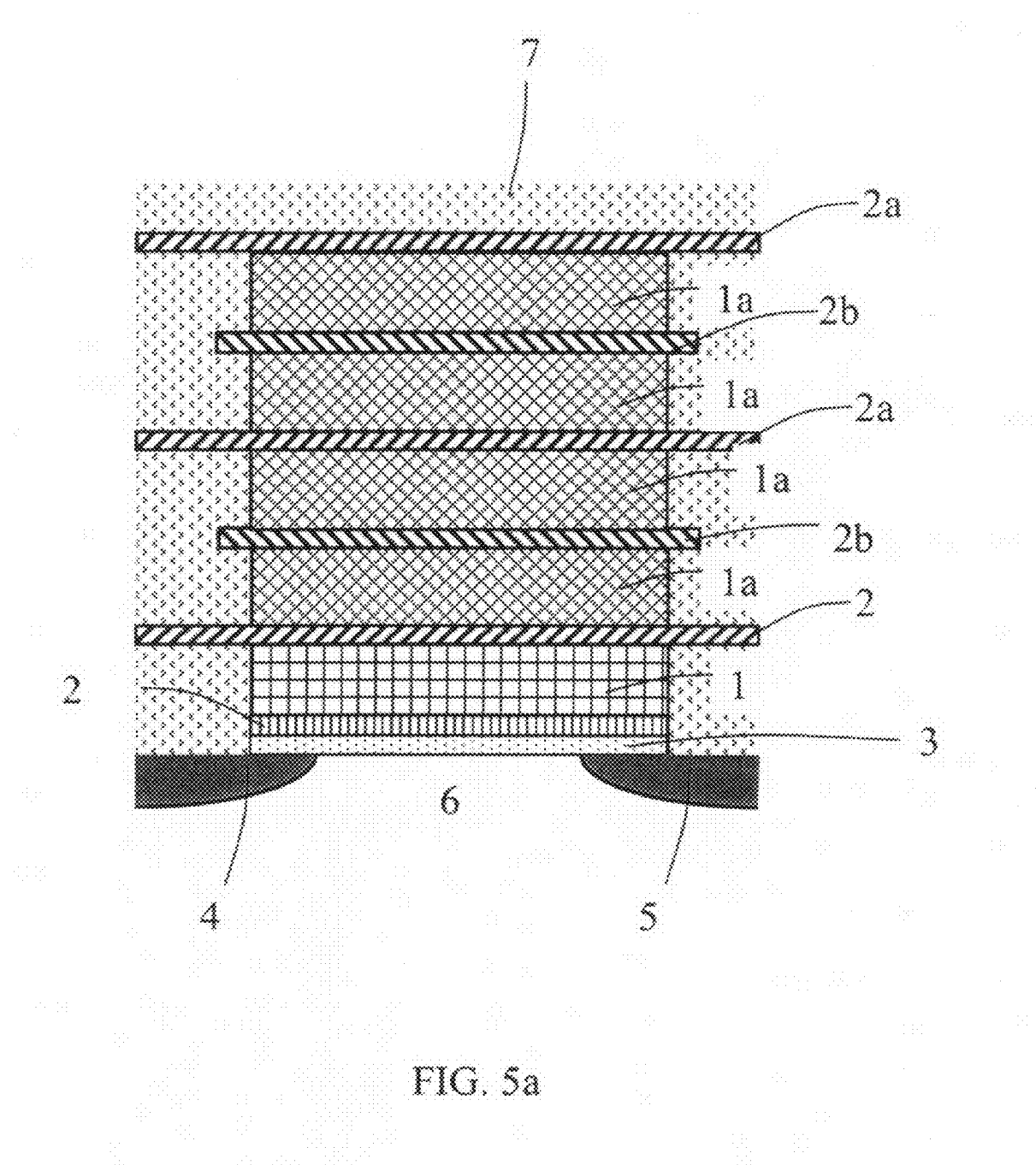

Claimed memory cell (FIG. 1) contains field transistor made on the base of silicon of p-type and consisting of the source (4), drain (5) and conductive channel (6). The floating gate (1) is made on the base of hard solution of plumbum (Pb) zirconate-titanate $Pb(ZrTi)O_3$ (PZT) and is a piezoelement separated from the conductive channel by the dielectric layer (3), made from silicon oxide. Over the piezoelement there is a memory cell (1a) made also on the base of PZT and separated from the piezoelement by the dielectric layer (3), made also from silicon oxide. All electrodes (2, 2a, 2b) are made from aluminum. At the primary initiation of the memory element operation polarizing voltage is once supplied to the upper electrode (2) of the piezoelement and to the source (4) of the transistor. Polarity of the supplied voltage is determined by the protocol of information exchange between the piezoelement and memory cell and can be selected at random. To program the memory cell (1a), electrodes (2a H 2b) are supplied with pulse voltage exceeding programming threshold and with the polarity adequate to the cell states ("0") and ("1"). To read information electrodes (2a and 2b) are supplied with pulse voltage lower than programming threshold. Polarity of readable voltage is also determined by the protocol of information exchange between the piezoelement and memory cell and can be selected at random. When readable voltage is supplied to electrodes (2a и 2b) in the memory cell resilience of ferroelectric memory cell material takes place and this material apparently has piezo properties. Resilience character is determined by polarization of ferroelectric memory cell material that was gained by the cell as a result of programming. This can be either compressure or expansion (extension) wave. The resilience causes the charge on the surface of the piezoelement that is at the same time the transistor floating gate. The charge polarity in its turn induced on the surface of the piezoelement directed to the conductive channel (6) of the transistor allows to identify the value of the current running through the transistor, on this value it is possible to identify how the memory cell was polarized, i.e. programmed.

Option 2

Figure 6:
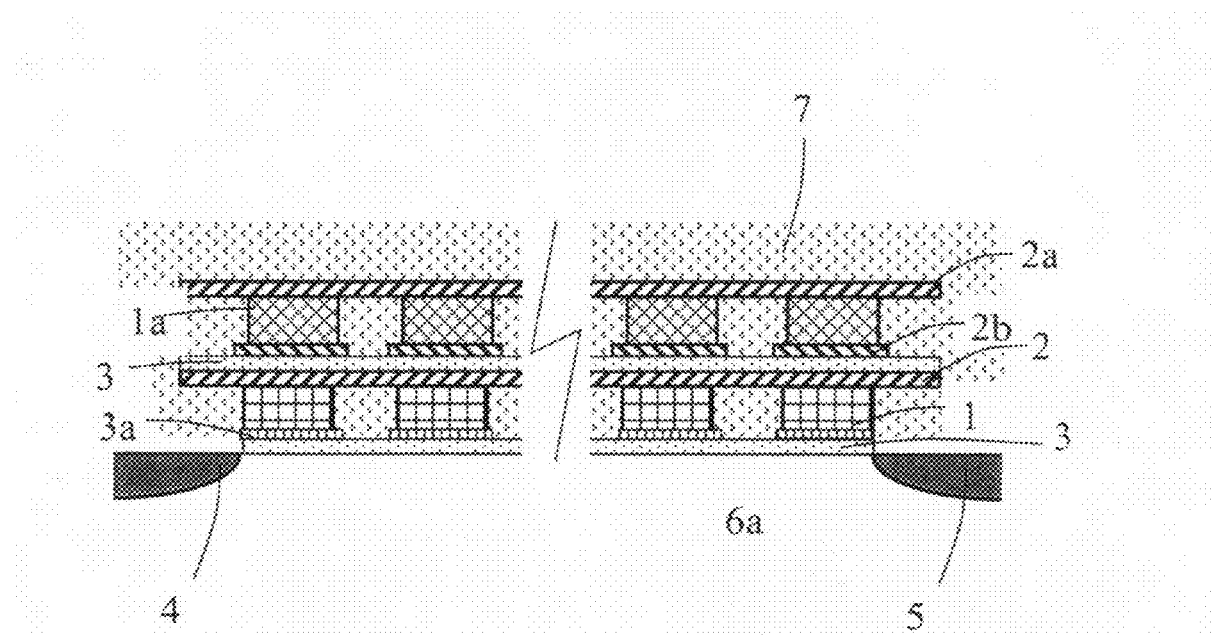
FIG. 6-9—claimed memory element and memory elements array made on the base of the field transistor with elongate channel.
Figure 6A:
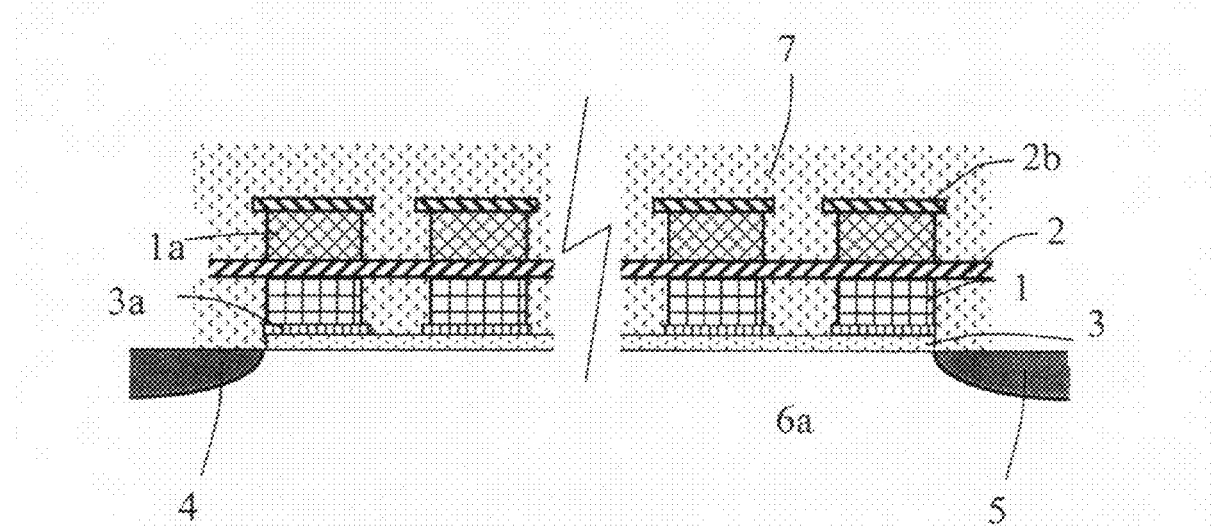
Figure 7:
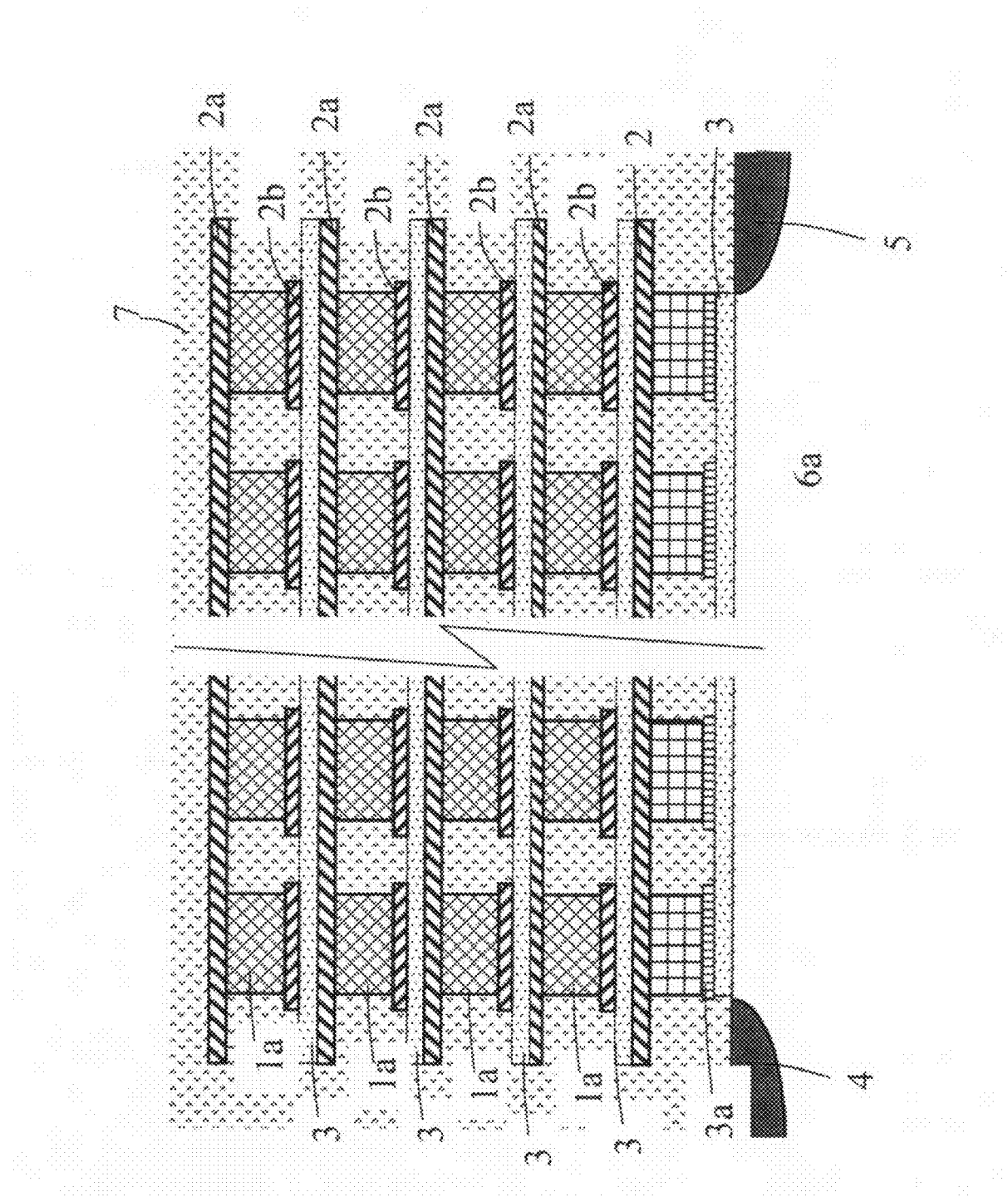
Figure 7A:
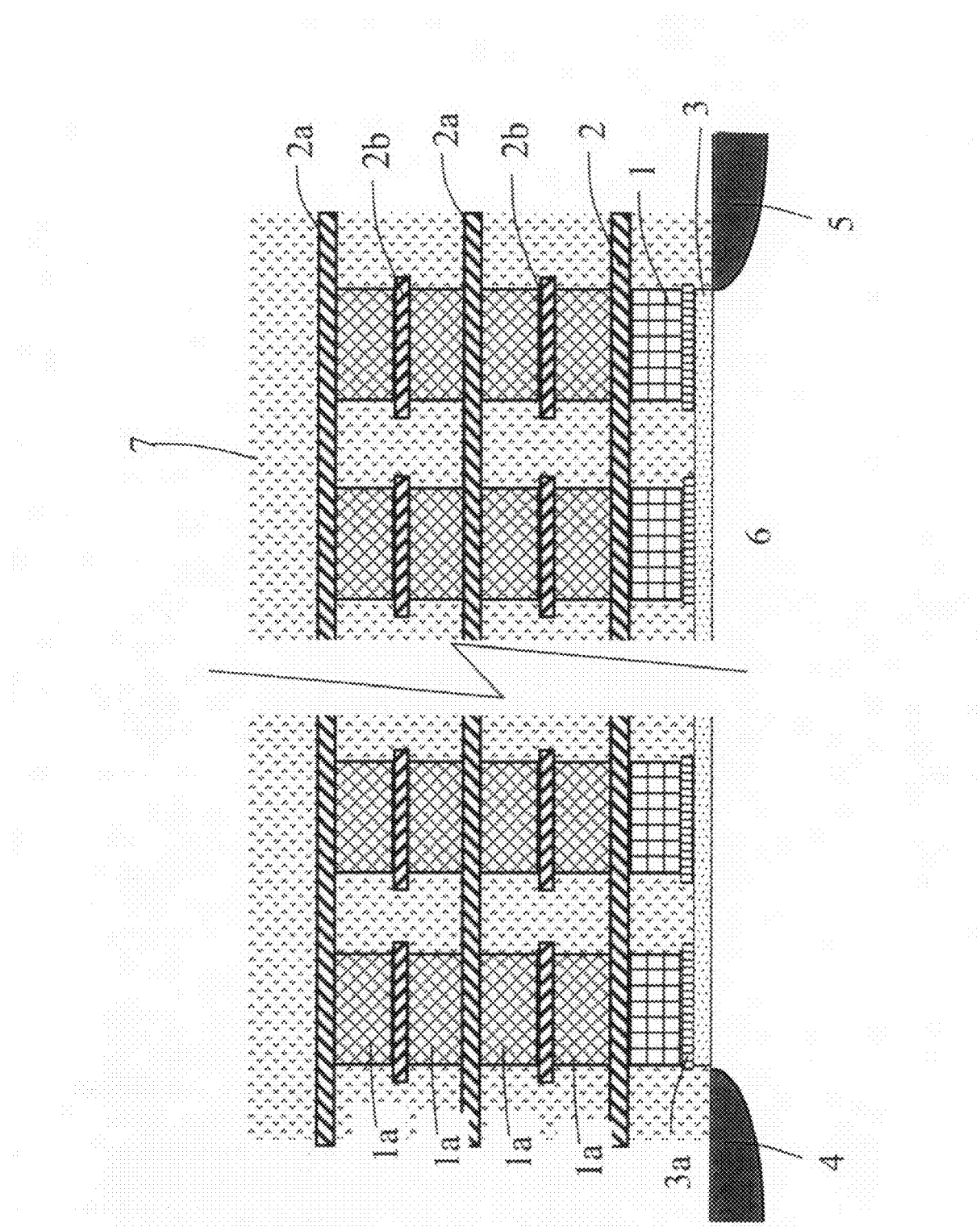
Figure 8:
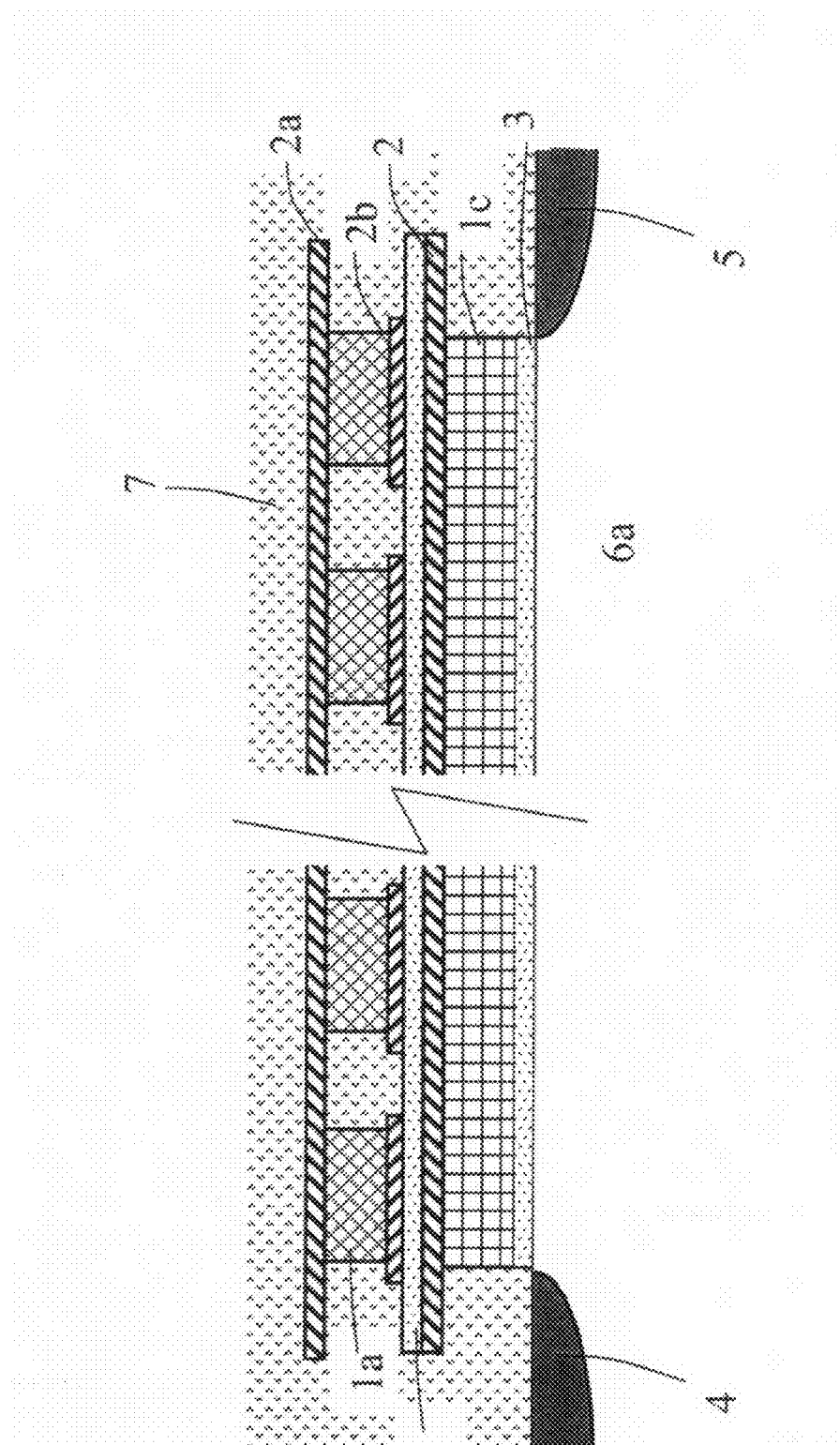
Figure 9:
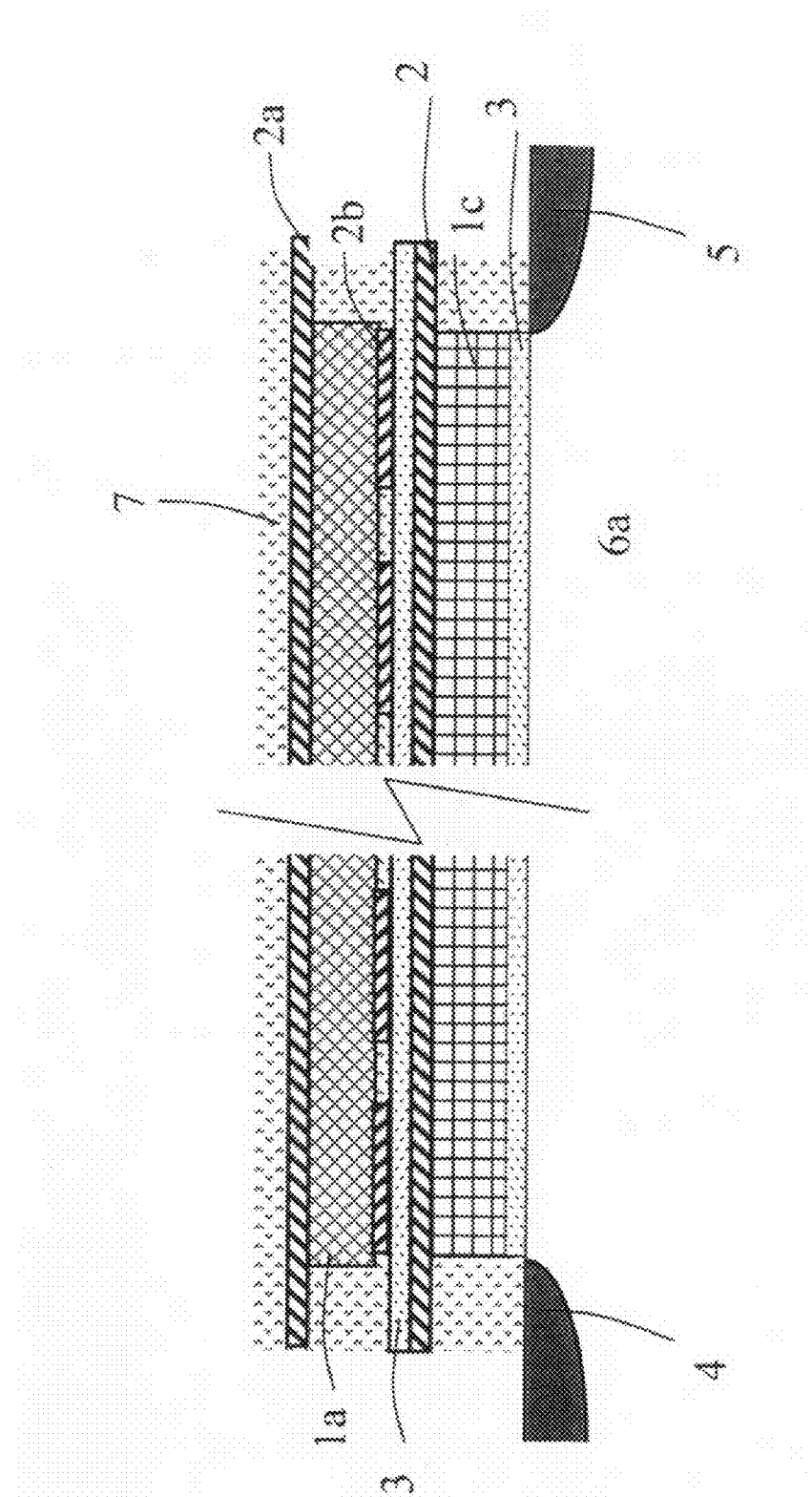
Figure 10:
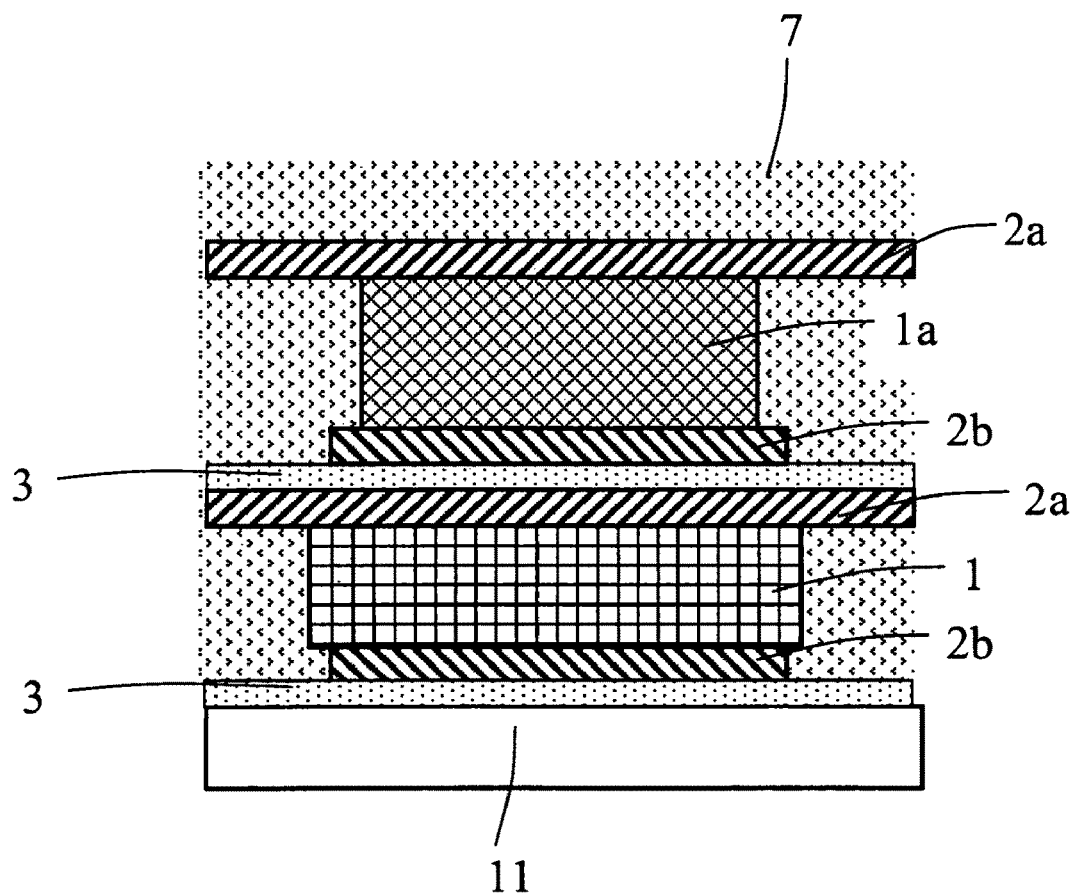
FIG. 10—claimed memory element consisting of two piezoelements separated from each other by dielectric layer and at least one of them is made on the base of ferroelectric material being a memory cell.
Figure 11:
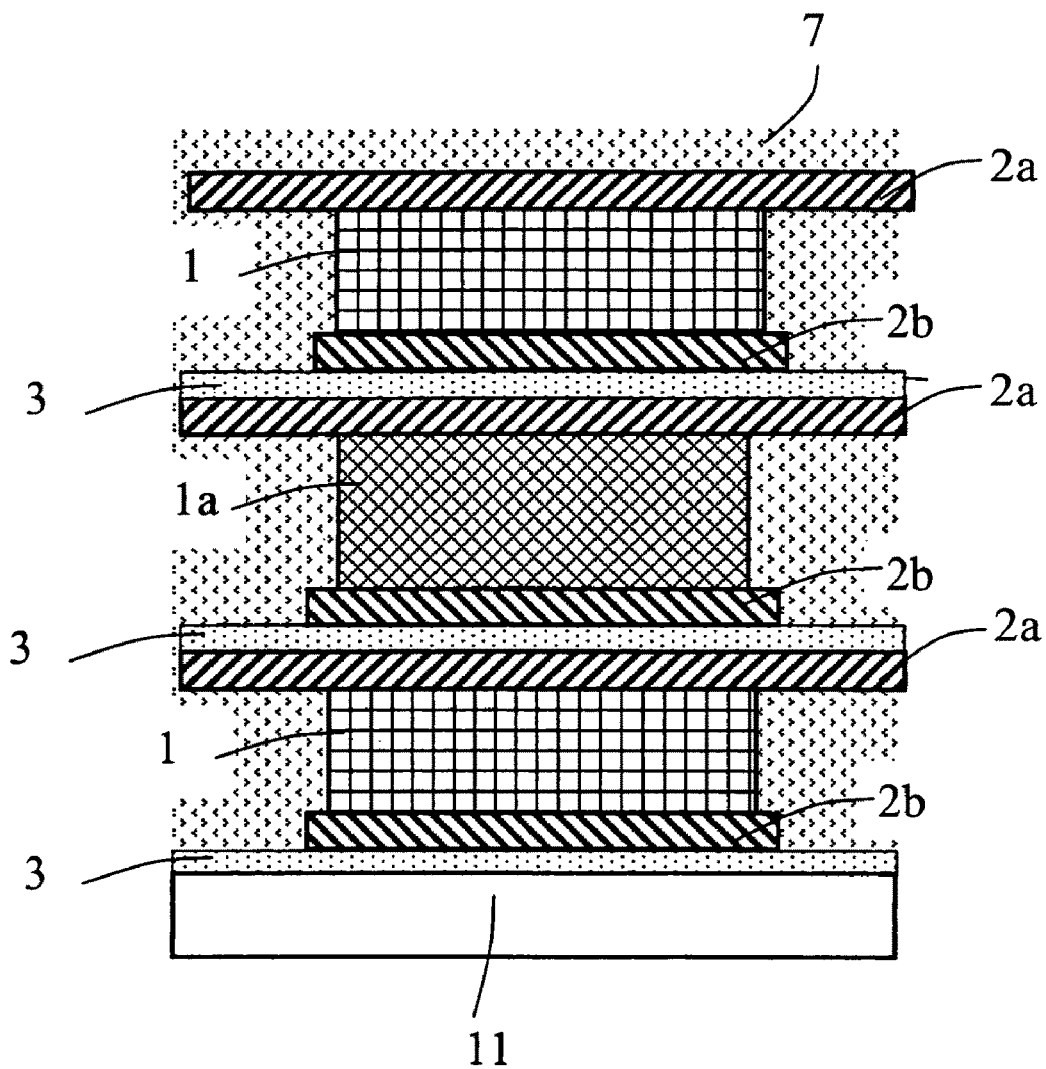
FIG. 11—claimed memory element consisting of three piezoelements separated from each other by dielectric layer and at least one of them is made on the base of ferroelectric material being a memory cell.
Figure 12:
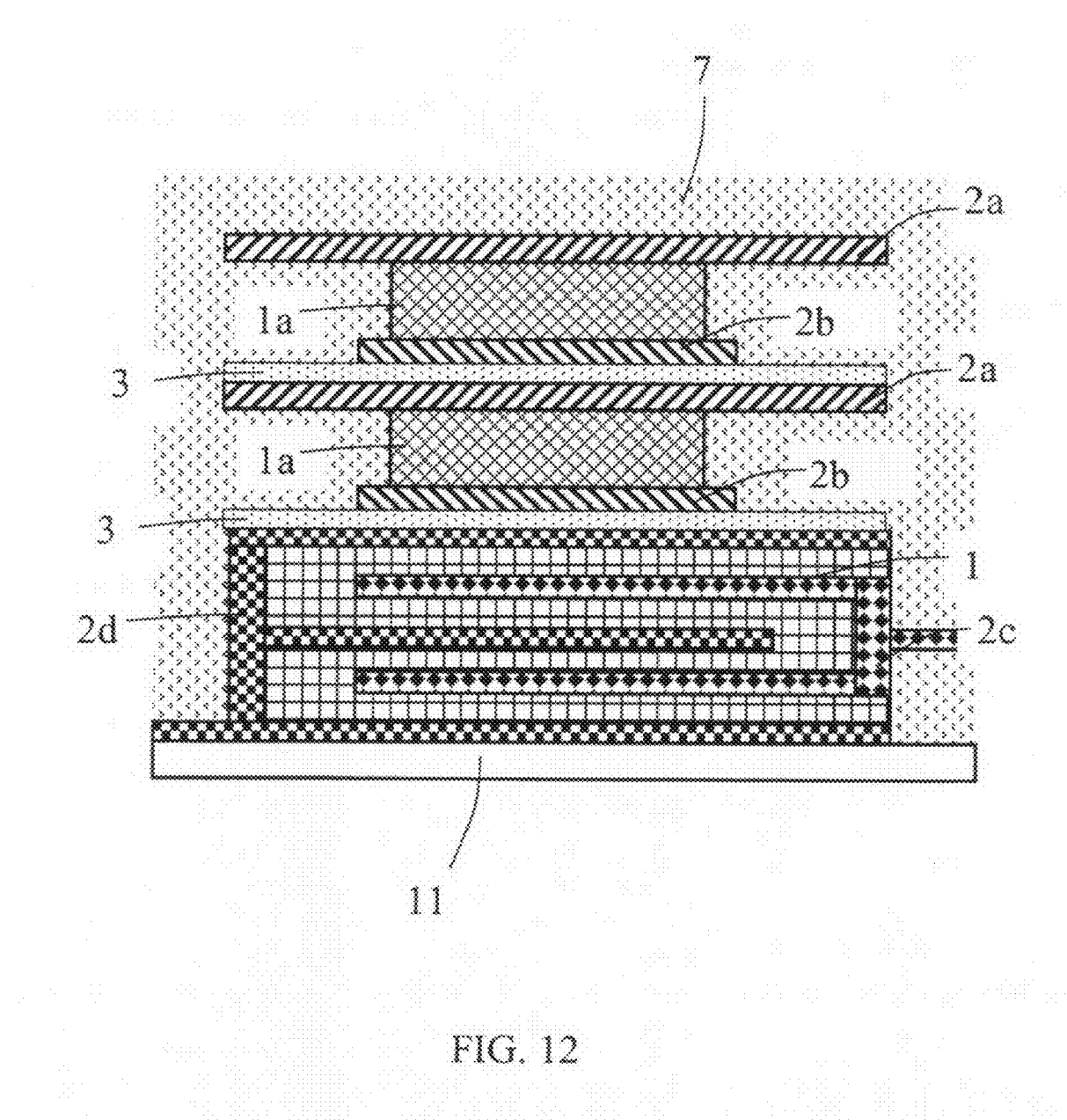
FIG. 12—claimed memory element and memory elements array made on the base of resilience source constructed as a multilayer piezoelement with the structure consisting of two ramified electrodes and a piezoelectric placed between them.
Figure 13:
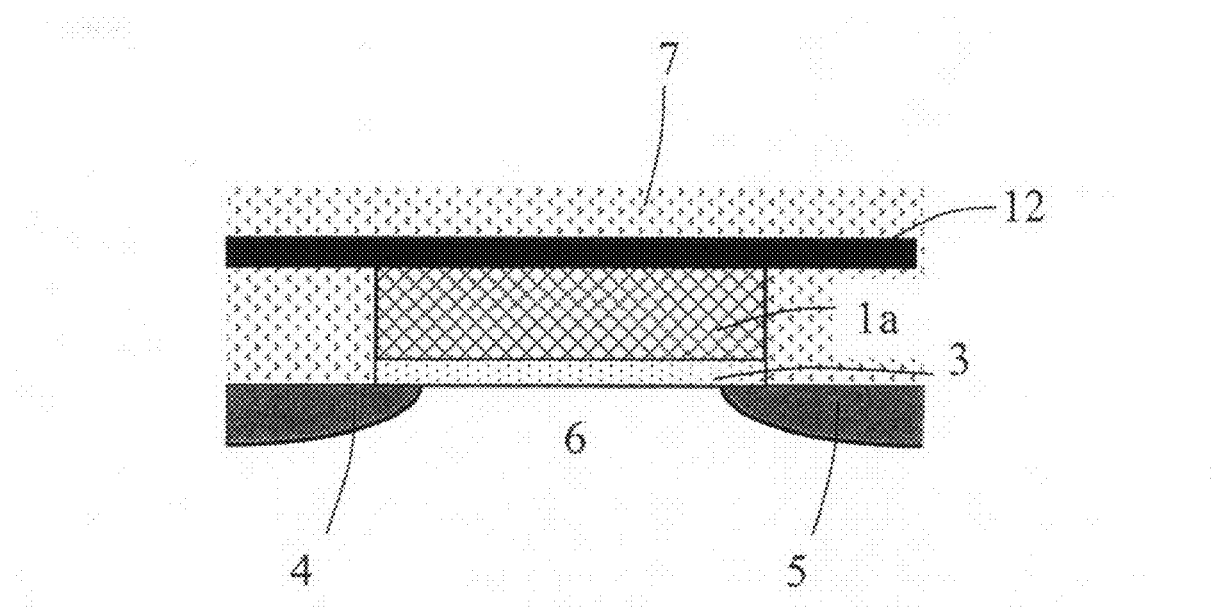
FIG. 13-13a—claimed ferroelectric memory elements using pyroelectric effect and made on the base of 1T FeRAM one-transistor cell containing field transistor.
Figure 13A:
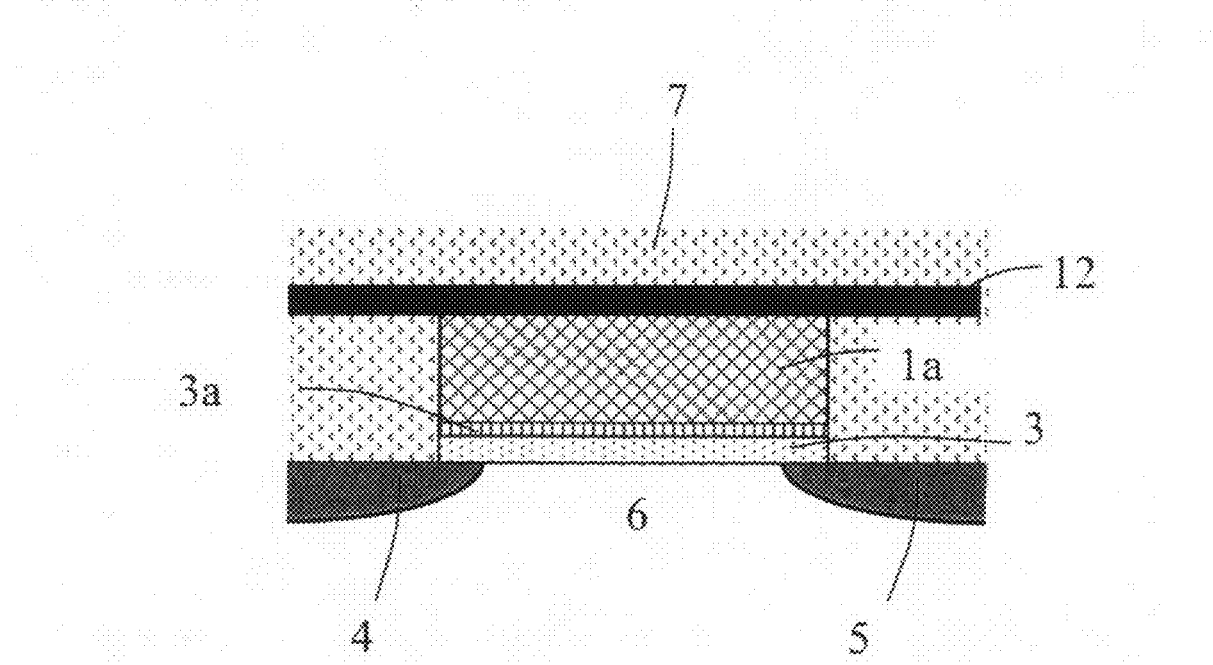
Figure 14:
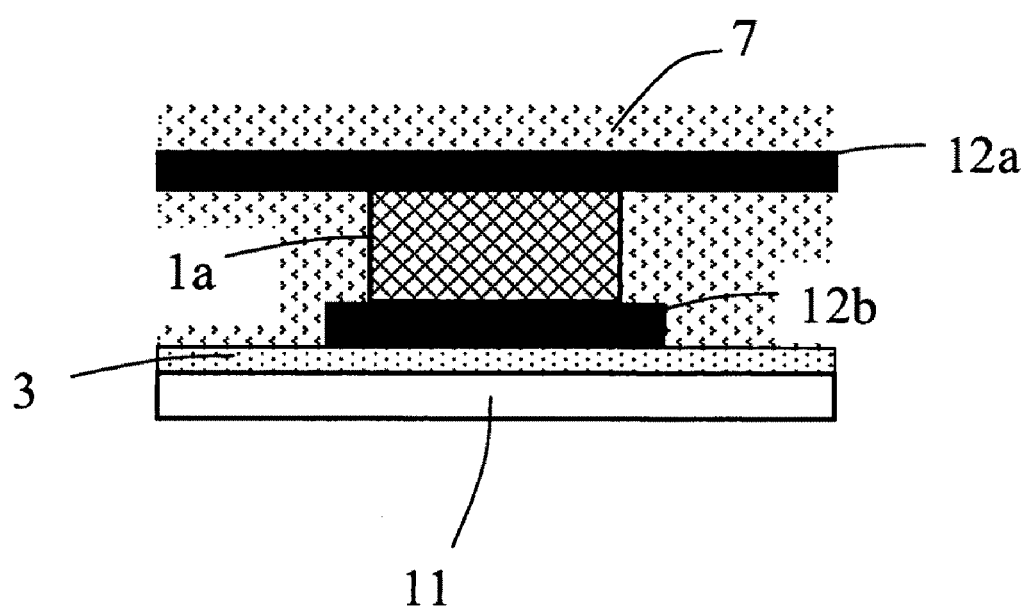
FIG. 14—claimed ferroelectric memory elements using pyroelectric effect and made on the base of 1C FeRAM one-capacitor cell.

On the (FIG. 6a) claimed memory cell contains also the field transistor produced on the basis of silicon of p-type and consisting of the source (4) and drain (5), but has elongate conductive channel (6a). This type of memory elements has several floating gates (1), also made on the base of solid solution of plumbum zirconat titanate Pb(ZrTi)03 (PZT) and all of them are piezoelements separated from the conductive channel by the dielectric layer (3), made from silicon oxide. Over every piezoelement corresponding memory cells are placed (1a), the memory is also made on the base of PZT and separated from piezoelements by the dielectric layer (3), also made from silicon oxide. All electrodes (2, 2a, 2b) are made analogically from aluminum. Initiation of the memory element and memory cells programming occurs analogically as it is described in Option 1. Reading proceeds as follows: the electrode gate (2) is supplied with voltage; this voltage opens the transistor and sets up maximum current running through the channel. As in the Option 1 for data reading electrodes (2a and 2b) are supplied with pulse voltage that at last results in charge induction on the definite sector of the piezoelement surface directed to the conductive channel of the transistor. In this option induced charge overlaps running current only on the certain sector of the conductive channel (6a). However this results in the heavy decrease of the current running through the transistor. On the fact of abrupt decrease of the current running through the transistor it is possible to identify how the memory cell-was programmed.

APPLICATION IN THE INDUSTRY

Thus, claimed memory cell can be considered new type of data storing devices. This will serve to production of new generation of chips with energy independent memory with high informational density, multifold and quick accessibility. Such memory chips will be widely applied in mobile phones, digital photo and video cameras and can replace hard drives in the computers. Ferroelectric memory elements of this type with low energy consumption can be also applied in construction of radio frequency identification devices and electronic books, being principally new type of information devices.

The invention claimed is:

1. A method of nondestructive data reading from the ferroelectric memory cell set with electrodes comprising next steps:
   supply of voltage to the electrodes for a resilience generation in the ferroelectric memory cell,
   registration of the resilience by a field transistor with a floating gate and/or a conductive channel made from a material with piezoelectric properties and according to a value of a current running through the field transistor identify degree and character of a ferroelectric memory cell polarization
   or register this resilience by a piezoelement made from a piezoelectric material placed between two electrodes and
   identify a ferroelectric memory cell polarization character according to the value and sign of a generated charge.

2. A ferroelectric memory element with a nondestructive method of data reading comprising
   field transistor containing source and drain separated from each other by a conductive channel,
   an electrode gate and a floating gate separated from the conductive channel by a dielectric layer or by metallic and dielectric layers,
   additionally comprising at least one extra piezoelement made from a ferroelectric material placed between two electrodes,
   said elements formed a memory cell with a formed zone of data storage, wherein
   the floating gate made from piezoelectric and field transistor being an indicator of a resilience generated by the memory cell when a reading potential is applied to the cell and forms data reading area.

3. The ferroelectric memory element according to claim 2 wherein a lower memory cell electrode separated from the electrode gate by a buffer dielectric layer or made conjoint with the electrode gate.

4. The ferroelectric memory element according to claim 2, wherein the data storage area made as a multiplayer structure comprising at least two layers of ferroelectric memory cells separated from each other by dielectric layers or every upper cell electrode made by conjoint with the lower memory cell electrode of the following layer.

5. The ferroelectric memory element according to claim 3, wherein the data storage area made as a multilayer structure comprising at least two layers of ferroelectric memory cells separated from each other by dielectric layers
   or every upper cell electrode made by conjoint with the lower memory cell electrode of the following layer.

6. The ferroelectric memory element according to claim 2, wherein the elongate conductive channel of the field transistor of the data reading area with at least two insulated floating gates placed over it and the data storage area made from at least one layer,
   comprising at least two memory cells, placed over the floating gates and separated or not separated from each other by the insulated dielectric in the layer.

7. The ferroelectric memory element according to claim 3, wherein the elongate conductive channel of the field transistor of the data reading area with two—four or more isolated floating gates placed over it and the data storage area made from at least one layer,
   comprising at least two memory cells, placed over the floating gates and separated or not separated from each other by the insulated dielectric in the layer,
   or from several layers of the memory cells separated by each other by dielectric layers.

8. The ferroelectric memory element according to claim 2, wherein the elongate conductive channel of the data reading area with at least two insulated floating gates placed over it and the data area made at least from one layer comprising at least two memory cells, placed over the floating gates and separated or not separated from each other by the insulating dielectric in the layer wherein every upper electrode of the memory cell of the previous layer is made conjoint with the lower electrode of the memory cell of the following layer.

9. The ferroelectric memory element according to claim 3, wherein the elongate conductive channel of the data reading area with at least two insulated floating gates placed over it and the data area made at least from one layer comprising at least two memory cells, placed over the floating gates and separated or not separated from each other by the insulating dielectric in the layer wherein every upper electrode of the memory cell of the previous layer is made conjoint with the lower electrode of the memory cell of the following layer.

10. A ferroelectric memory element with nondestructive method of data reading including
field transistor containing source and drain separated from each other by a conductive channel made from a semiconductor material with piezoelectric properties and electrode gate, separated from the conductive channel by a dielectric layer,
wherein at least one more extra piezoelement made from a ferroelectric material placed between two electrodes, being the memory cell with a formed data storage area,
the field transistor being an indicator of a resilience, generated by the memory cell if a reading potential is applied to the cell, and forming the data reading area.

11. The ferroelectric memory element according to claim 10
wherein a lower electrode of the cell memory separated from the electrode gate of the field transistor by the dielectric layer
or made conjoint with the electrode gate.

12. The ferroelectric memory element according to claim 11
wherein the conductive channel of the field transistor made on a base of the ferroelectric semiconductor or on a base of heterostructures.

13. The ferroelectric memory element according to claim 10
wherein the data reading area constructed as a multiplayer structure comprising at least two layers of ferroelectric memory cells, separated from each other by dielectric layers, wherein every upper memory element electrode is made conjoint with the lower electrode of the memory cell of the following layer.

14. The ferroelectric memory element according to claim 11,
wherein the data reading area constructed as a multiplayer structure
comprising at least two layers of ferroelectric memory cells,
separated from each other by dielectric layers, wherein every upper memory element electrode is made conjoint with the lower electrode of the memory cell of the following layer.

15. The ferroelectric memory element according to claim 12
wherein the data reading area constructed as a multiplayer structure
comprising at least two layers of ferroelectric memory cells, separated from each other by dielectric layers,
wherein every upper memory element electrode is made conjoint with the lower electrode of the memory cell of the following layer.

16. The ferroelectric memory element according to claim 10
wherein the elongate conductive channel of the field transistor of the data reading area and the data reading area made from at least one layer
comprising at least two memory elements placed over the electrode gate and separated or not separated from each other by insulating dielectric.

17. The ferroelectric memory element according to claim 11
wherein the elongate conductive channel of the field transistor of the data reading area and the data reading area made from at least one layer
comprising at least two memory elements placed over the electrode gate and separated or not separated from each other by insulating dielectric.

18. The ferroelectric memory element according to claim 12
wherein the elongate conductive channel of the field transistor of the data reading area and the data reading area made from at least one layer
comprising at least two memory elements placed over the electrode gate and separated or not separated from each other by insulating dielectric.

19. The ferroelectric memory element according to claim 10
wherein the elongate conductive channel of the field transistor of the data reading area and the information storage area made from at least one layer
comprising at least two memory cells placed over the electrode gate
and separated or not separated from each other by the insulating dielectric,
and wherein every upper electrode of the memory cell of the previous layer is made conjoint with the lower electrode of the memory cell of the following layer.

20. The ferroelectric memory element according to claim 11
wherein the elongate conductive channel of the field transistor of the data reading area and the information storage area made from at least one layer
comprising at least two memory cells placed over the electrode gate
and separated or not separated from each other by the insulating dielectric,
and wherein every upper electrode of the memory cell of the previous layer is made conjoint with the lower electrode of the memory cell of the following layer.

21. The ferroelectric memory element according to claim 12
wherein the elongate conductive channel of the field transistor of the data reading read and the information storage area made from at least one layer
comprising at least two memory cells placed over the electrode gate
and separated or not separated from each other by the insulating dielectric,
and wherein every upper electrode of the memory cell of the previous layer is made conjoint with the lower electrode of the memory cell of the following layer.

22. A ferroelectric memory element with nondestructive method of data reading including
a one-transistor memory cell containing a field transistor with a source and drain separated from each other by a conductive channel, an electrode, floating gate made from the ferroelectric material and separated from the conductive channel by a dielectric layer or by dielectric and metallic layers,
wherein the electrode gate made from a material with increased resistance resulting in conditions of a running pulse current in the electrode heating and then in heating of the ferroelectric cell material and causing generation of charge on a ferroelectric charge surface,
sign and value of this charge depend on an information recorded in the ferroelectric material.

* * * * *